(12) United States Patent
Misra et al.

(10) Patent No.: US 6,339,120 B1
(45) Date of Patent: Jan. 15, 2002

(54) METHOD OF PREPARING THERMALLY CONDUCTIVE COMPOUNDS BY LIQUID METAL BRIDGED PARTICLE CLUSTERS

(75) Inventors: Sanjay Misra, Shoreview; Richard M. Olson, Mahtomedi, both of MN (US)

(73) Assignee: The Bergquist Company, Chanhassen, MN (US)

( * ) Notice: Subject to any disclaimer, the term of this patent is extended or adjusted under 35 U.S.C. 154(b) by 0 days.

(21) Appl. No.: 09/543,661

(22) Filed: Apr. 5, 2000

(51) Int. Cl.$^7$ ................................................. C08K 3/00
(52) U.S. Cl. ......................... 524/404; 524/434; 524/439
(58) Field of Search ................................. 524/404, 434, 524/439

(56) References Cited

U.S. PATENT DOCUMENTS

| | | |
|---|---|---|
| 3,226,608 A | 12/1965 | Coffin, Jr. |
| 3,248,615 A | 4/1966 | Weisshaar et al. |
| 4,129,881 A | 12/1978 | Reichel et al. |
| 4,147,669 A | 4/1979 | Shaheen et al. |
| 4,233,103 A | 11/1980 | Shaheen |
| 4,254,431 A | 3/1981 | Babuka et al. |
| 4,323,914 A | 4/1982 | Berndlmaier et al. |
| 4,398,975 A | 8/1983 | Ohsawa et al. |
| 5,012,858 A | 5/1991 | Natori et al. |
| 5,024,264 A | 6/1991 | Natori et al. |
| 5,053,195 A | 10/1991 | McKay |
| 5,056,706 A | 10/1991 | Dolbear et al. |
| 5,170,930 A | 12/1992 | Dolbear et al. |
| 5,173,256 A | 12/1992 | Booth et al. |
| 5,198,189 A | 3/1993 | Booth et al. |
| 5,225,157 A | 7/1993 | McKay |
| 5,328,087 A | 7/1994 | Nelson et al. |
| 5,445,308 A | 8/1995 | Nelson et al. |

OTHER PUBLICATIONS

IBM Technical Disclosure Bulletin, vol. 19, No. 8, Jan. 1977 "Thermal Enchancement of Modules", E. B. Hultmark et al.
IBM Technical Disclosure Bulletin, vol. 20, No. 11B, Apr. 1978 "Electronic Packaging Structure", A. J. Arnold et al., pp. 4820–4822.
IBM Technical Disclosure Bulletin, vol. 20, No. 11B, Apr. 1978 "Liquid–Metal–Cooled Integrated Circuit Module Structures", E. Berndlmaier et al. pp. 4817 and 4818.
Harman, "Hard Gallium Alloys for Use as Low Contact Resistance Electrodes and for Bonding Thermocouples into Samples", *The Review of Scientific Instruments*, Jul. 1960, vol. 31, No. 7, pp. 717–720.

Primary Examiner—Edward J. Cain
(74) Attorney, Agent, or Firm—Haugen Law Firm PLLP

(57) ABSTRACT

A thermally conductive mechanically compliant pad including a quantity of gallium and/or indium alloy liquid at temperatures below about 120° C. and a boron nitride particulate solid blended into the liquid metal alloy to form a paste. The paste is then combined with a quantity of a flowable plastic resin such as silicone oil to form the mechanically compliant pad, the compliant pad comprising from between about 10% and 90% of metallic coated particulate, balance flowable plastic resin.

7 Claims, 5 Drawing Sheets

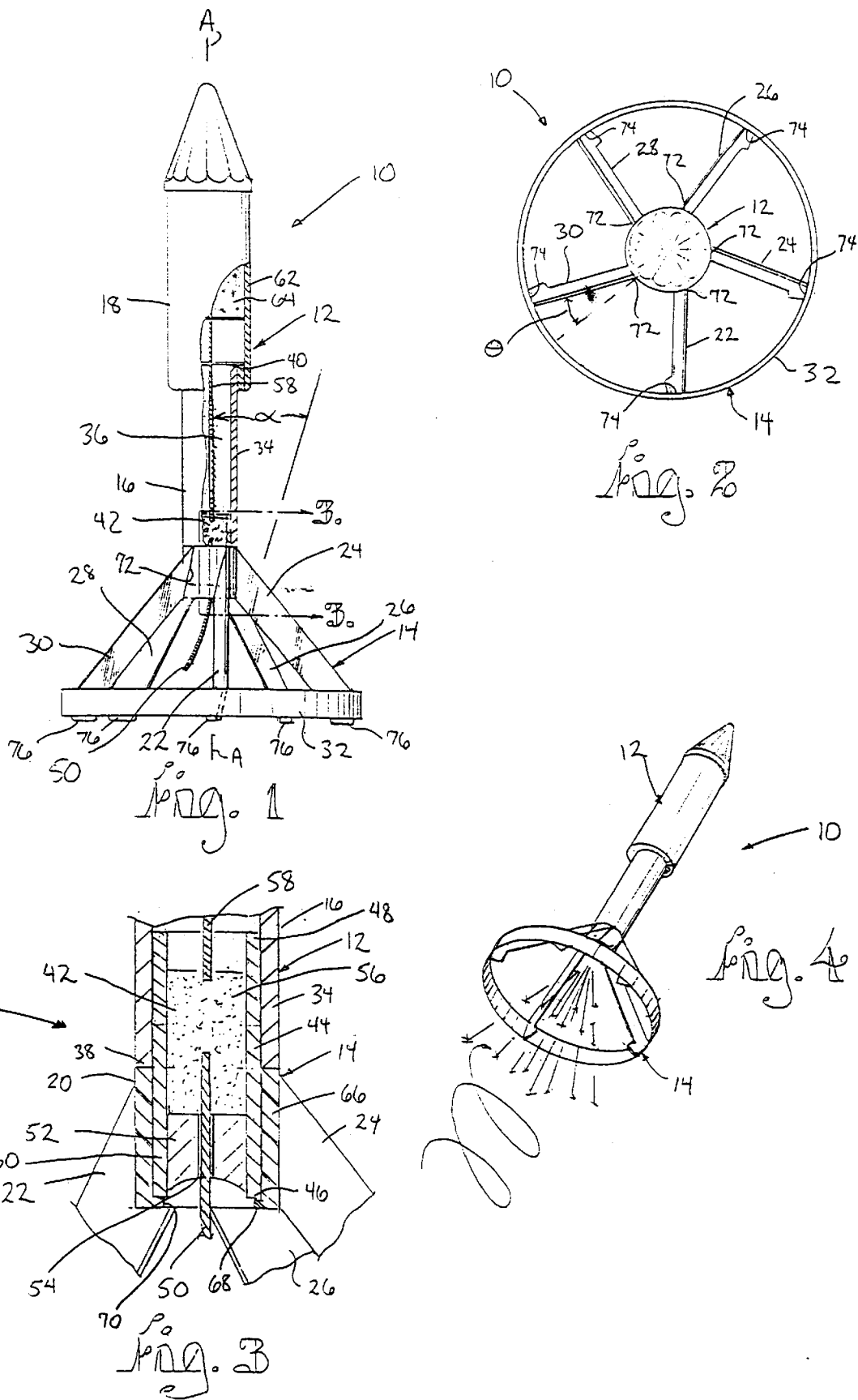

METHOD OF PREPARING THERMALLY CONDUCTIVE COMPOUNDS BY LIQUID METAL BRIDGED PARTICLE CLUSTERS

BACKGROUND OF THE INVENTION

The present invention relates generally to a method of preparing thermally conductive mechanically compliant compounds for improving heat transfer from a heat generating semiconductor device to a heat dissipator such as a heat sink or heat spreader. More specifically, the present invention relates to a technique for preparing highly thermally conductive polymer compounds such as a polymer liquid loaded or filled with percolating particulate clusters coated with a liquid metal. Such compounds are highly effective through liquid metal enhanced percolation. More particularly, the present invention involves a process for uniformly coating particulate solids with a liquid metal, and thereafter blending the coated particulate with a liquid or fluid polymer for forming the compliant pad with thermal vias therein.

In the past, liquid metals have been proposed for incorporation in thermally conductive pastes for heat generating semiconductor devices. In most cases, the application of liquid metals for this purpose was not widely used, primarily because of problems created with the tendency of the liquid metal to form alloys and/or amalgams, thereby altering and modifying the physical properties of the liquid metal containing mounting pad. In addition, the highly thermally conductive pastes of the prior art are always electrically conductive which may not be desirable in certain applications and situations. In certain other situations, liquid metals and/or alloys of liquid metal were blended with a polymer, with the polymer thereafter being cured in order to provide a composite thermally conductive mounting pad. While useful, these devices did not find widespread application due primarily to the instability of the liquid metal component in the finished product. This instability is due to the extremely high surface tension as well as other chemical and physical properties of the liquid metal component. By way of example, the dispersed liquid metal droplets had a tendency to coalesce, a process of Ostwald ripening, and cause macroscopic separation of the metal from the polymer matrix.

The present invention utilizes the combination of a liquid metal coated particulate with a polymer carrier to prepare a thermal bridge having highly desirable thermal and electrical properties, and adapted to be configured to be interposed between a semiconductor device and a heat dissipator. The method of preparation described in the invention also renders the compounds highly stable in terms of macroscopic phase separation. In addition, the method of preparation renders possible the formation of large percolating clusters of liquid metal coated particles which enhances heat transfer. The combination also possesses desirable mechanical properties which facilitate its use in production operations.

SUMMARY OF THE INVENTION

In accordance with the present invention, a particulate such as boron nitride, alumina or aluminum nitride is initially dried, and thereafter placed in contact with a liquid metal, typically a metal that is liquid at room temperature or melting at a relatively low temperature, typically below 120° C. and preferably below 60 ° C. Preferably, the liquid metal comprises an alloy of gallium and/or indium, such as a gallium-indium-tin-zinc alloy, a bismuth-indium alloy or a tin-indium-bismuth alloy. In order to appropriately wet the surfaces of the particulate, a mixture of dried particulate and liquid metal is subjected to a mixing operation until the particulate is uniformly coated with the liquid metal. While not absolutely necessary, it is desirable that the boron nitride particulate be dry before blending with the liquid metal alloy. At this stage of mixing one obtains a thixotropic paste of liquid metal and the powder. One can also visualize the paste as a large percolating cluster.

Following the coating operation, the coated particulate is mixed with a liquid polymeric carrier material such as, for example, liquid silicone oil of a desired or selected viscosity. It is preferred that the liquid metal particulate be incorporated in the silicone mixture at or near the packing limit. For liquid metal coated boron nitride, the packing fraction is typically between about 60% and 65% by volume coated particles, balance liquid silicone. At these volume fractions, one obtains mechanically compliant compounds that have excellent thermal conductivity due to high packing density. This improves heat transfer due to the creation of a compliant interface between the opposed spaced-apart surfaces of the semiconductor device and the heat sink.

In preparing the mechanically compliant highly thermally conductive bridges in accordance with the present invention, the thermally conductive particulate is initially selected, with boron nitride being the preferred particulate. Materials such as aluminum oxide (alumina), and aluminum nitride have also been found to be useful when properly dried prior to contact with the liquid metal. For the application of the present invention, the particle size should be such that the average cross-sectional thickness is less than about 5 microns. A liquid metal, preferably a low melting alloy, is added to the particulate and mechanically mixed until the particulate surface is substantially uniformly wet by the liquid metal and a uniform paste is formed. Thereafter, a liquid polymer, preferably a liquid or fluid silicone polymer is added to the liquid metal paste to form a blend, with this blend being subjected to a mechanical mixing operation which typically includes a vigorous or high-speed mixing step, with vigorous mixing being continued until a visually smooth paste is formed.

When incorporated into liquid silicone, it has been found that the addition of the liquid metal coated particulate effectively reduces viscosity. The mechanism involved in this alteration of viscosity is believed to be due to the reduction of viscous drag at the "effective particle"-silicone oil interface. The liquid metal coating increases the sphericity of the configuration of the particulate, and also contributes to an effective "softness" of the otherwise hard particles. These two factors function in a mutually cooperative fashion so as to reduce both viscosity and modulus of the resulting composite.

It has been found further that the liquid metal coated particulate, in addition to effectively transferring heat and/or thermal energy, also anchors the liquid metal into a three phase composite to prevent gross migration. The three phases are particle-liquid metal-polymer. By increasing the viscosity of the metal phase, the tendency of metal droplets to migrate and coalesce into large drops that could macroscopically separate and leak from the composite is severely retarded. Furthermore, it has been found that the liquid coated particulate provides a Bingham-plastic like character in the resultant composite, this allowing the paste to remain static in the absence of external stress, and yet conform and/or flow easily when subjected to stress.

Because of the tendency to undergo liquid-to-liquid macroscopic separation, liquid metals do not blend well with polymer liquids, including silicones. In accordance with the present invention, however, when particulate, in particular boron nitride, is initially coated with a gallium alloy, the microscopic separation phenomena is reduced, with the liquid metal being supported or retained in coated particulate form, due to the increased thixotropy of the metal phase. In addition, the coated particulate, when added to silicone, functions effectively to form thermal vias within the composite. In certain cases, the thermal conductivity of the particulate such as boron nitride, may even exceed that of the liquid metal, for example, a eutectic alloy of gallium, tin and indium.

It is a further feature of the invention that in addition to its thermal properties, the composite possesses desirable electrical properties as well. Formulations having the optimal thermal properties have been found to possess electrical volume resistivity in the range of $10^8$ to $10^{12}$ Ω-cm.

Briefly, the technique of the present invention involves the steps of initially selecting a particulate material for the application. Boron nitride particles are particularly desirable, with those particles having a BET surface area of 0.3 $m^2 \cdot g^{-1}$ have been found quite useful. Boron nitride is typically configured in the form of anisotropic platelet-like particles, with plate diameter ranging from about 5–50 μm and the plate thickness being from about 2–3 μm. The next step is coating of the particulate. When coated with liquid metal, these particles have liquid metal/boron nitride volume ratios ranging from 4:1 to 1:1. Coating is achieved by mechanically mixing as previously stated. This is followed by the addition of the appropriate amount of liquid or fluid silicone to the coated particulate, with this addition being followed by high-speed mixing until a visually smooth paste is obtained.

As indicated above, while boron nitride is the preferred particulate, favorable results have been achieved through the utilization of alumina, with the alumina typically requiring a pre-treatment which involves thorough drying of the particulate. Other particulates such as aluminum nitride can also form liquid metal pastes after thorough drying.

Therefore, it is a primary object of the present invention to provide an improved particulate material which in addition to being highly thermally conductive, functions to anchor a liquid metal into a three phase composite.

It is a further object of the present invention to provide an improved method of preparing a thermally conductive bridge between the opposed surfaces of a heat generating semiconductor device and a heat dissipating surface, with the thermally conductive bridge comprising a three phase composite consisting of inorganic particulate-liquid metal-liquid silicone polymer.

Other and further objects of the present invention will become apparent to those skilled in the art upon a study of the following specification, appended claims, and accompanying drawings.

IN THE DRAWINGS

FIG. 1 is a diagrammatic or demonstrative display of improved contact between particulate (BN) coated with liquid metal. It is clear that the surface wetting of the particulate provides a significant reduction in surface resistivity between adjacent particles;

FIG. 2 is a demonstrative sketch illustrating the response of the polymer matrix filled with particulate by creating clusters on a larger length scale, and further illustrating the desirable response of the composite when the volume fraction of the liquid metal coated particles near the packing limit for spherical particles, with this sketch illustrating the feature of high concentration so as to obtain thermal percolation near the critical packing fraction;

DESCRIPTION OF THE PREFERRED EMBODIMENTS

Figure 5:
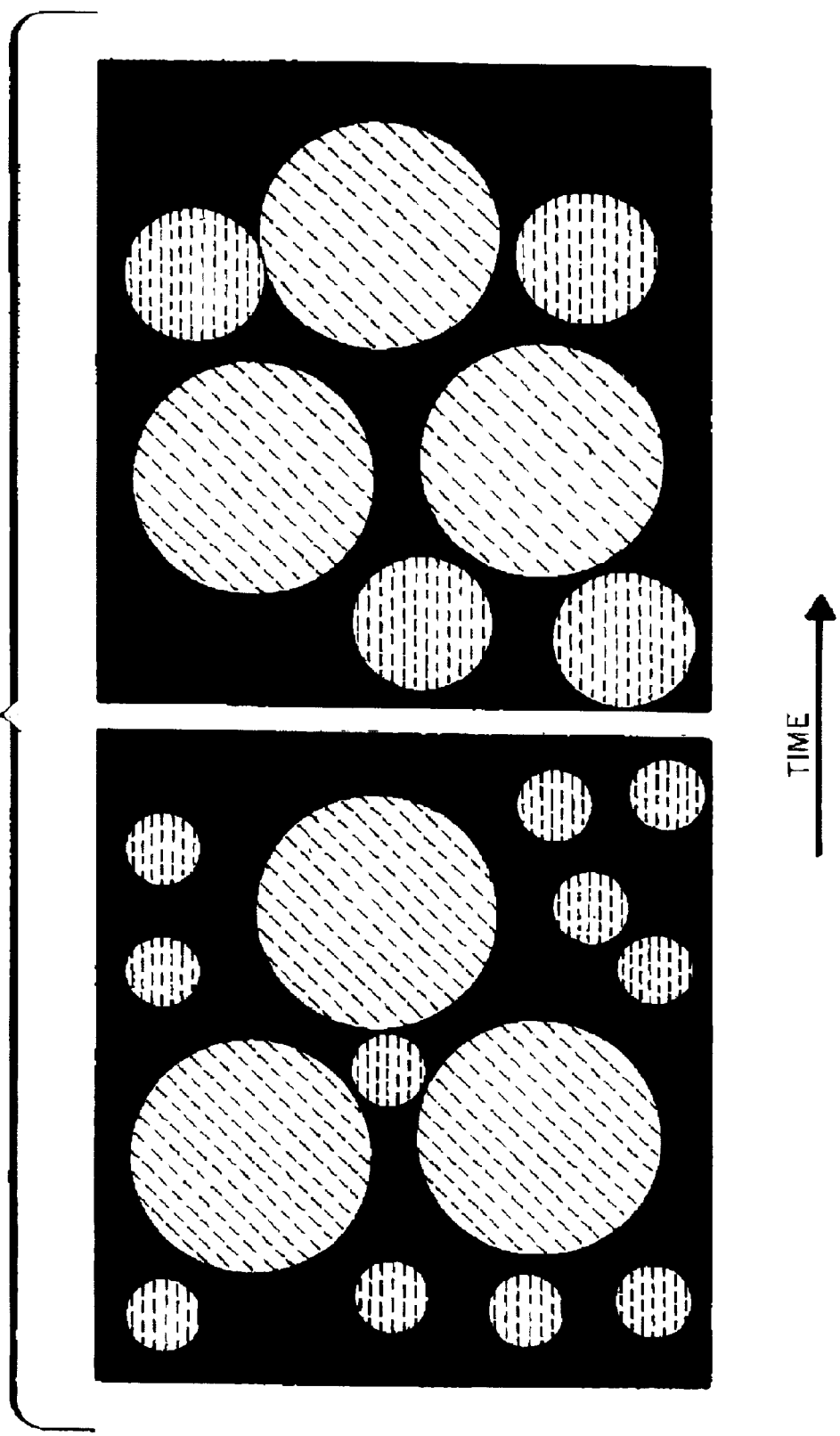
FIG. 5 is a showing of aggregation and separation of discrete liquid gallium metal droplets so as to achieve the results of the present invention.

In order to describe the preferred embodiments, the following examples are given:

EXAMPLE I

| Alloy | Melting Point (° C.) | Gallium (%) | Indium (%) | Tin (%) | Bismuth (%) | Zinc (%) |
|---|---|---|---|---|---|---|
| 1 | 7 | 61 | 25 | 13 | 0 | 1 |

The particulate selected was boron nitride, with the particulate having the normal platelet-like configuration and averaging 40 microns in diameter, and 2 microns in cross-sectional thickness. This particulate is readily wetted by the gallium alloy. When coated with the liquid gallium alloy, the BN powder did not form hard aggregates, but rather formed a thixotropic paste. This configuration is desirable inasmuch as BN has a high thermal conductivity in the "in-plane" direction, with the conductivity being substantially improved with liquid metal bridging. BN has a specific gravity of 2.25 and a thermal conductivity (in-plane) of 350 $W \cdot m^{-1} \cdot K^{-1}$ (orientationally averaged thermal conductivity is reported around 60 $W \cdot m^{-1} \cdot K^{-1}$). The polymer matrix chosen was a silicone oil with a kinematic viscosity of 100 centistokes, a specific gravity of 0.86 and a thermal conductivity of 0.15 $W \cdot m^{-1} \cdot K^{-1}$. The metal has a specific gravity of 6.5 and a thermal conductivity of 20 $W \cdot m^{-1} \cdot K^{-1}$.

The anisotropic platelet BN particles were initially coated with the liquid gallium alloy. The liquid metal-to-BN volume ratios were selected in three different ranges as set forth in Table I hereinbelow:

TABLE I

| | Formulation: | | | | | |
|---|---|---|---|---|---|---|
| | 1 | | 2 | | 3 | |
| Material | Parts Wt. | Volume % | Parts Wt. | Volume % | Parts Wt. | Volume % |
| BN (40 μm) | 100 | 14 | 0 | 0 | 0 | 0 |
| BN (10 μm) | 0 | 0 | 100 | 14 | 100 | 15 |
| [Liquid gallium] Alloy 1 {of Example I} | 1000 | 49 | 1000 | 49 | 800 | 43 |
| Silicone oil | 100 | 37 | 100 | 37 | 100 | 42 |

The coating was accomplished by mechanically mixing the BN powder with the liquid gallium alloy of Example I, and this may be achieved either by hand or in a high-speed mixer. Mixing was followed by addition of the appropriate amount of the silicone oil followed by high-speed mixing until a visually smooth paste was obtained.

The mixing procedure stabilizes the compound. The surface tension of silicone oil is around 20 mN-m$^{-1}$ whereas for the liquid metal it is of the order of 400–500 mN-m$^{-1}$. This means that the spreading coefficient or the ability of silicone oil to wet the surface is far greater than that of a liquid metal. Thus, the BN particulate is coated with liquid metal prior to contact with silicone oil so as to achieve proper and desirable wetting. Specifically, the following advantages are present:

1. The material will form liquid bridges; and
2. There is a reduced amount of macroscopic separation of the liquid metal.

Tests have indicated that when all materials of the formulation are mixed together without following the sequential steps of the present invention, the powder is not properly wetted with the liquid metal. The sequencing of the mixing steps is key to successfully making a stable, thermally conductive compound.

EXAMPLE II

| Alloy | Melting Point (° C.) | Gallium (%) | Indium (%) | Tin (%) | Bismuth (%) | Zinc (%) |
|---|---|---|---|---|---|---|
| 2 | 60 | 0 | 51 | 16.5 | 32.5 | 0 |

The particulate selected was aluminum oxide or alumina, a particulate of spherical symmetry, with a diameter of 3 μm and a BET surface area of 2 m$^2$/g. Both alumina and the alloy were heated to 100° C. (above melt point of Alloy 2) and mixed. When coated with the liquid alloy, the alumina formed a smooth, thixotropic paste. Alumina has a specific gravity of 3.75 and a thermal conductivity 25 W-m$^{-1}$-K$^{-1}$. The polymer matrix chosen was a silicone oil with a kinematic viscosity of 100 centistokes, a specific gravity of 0.86 and a thermal conductivity of 0.15 W-m$^{-1}$-K$^{-1}$. The liquid metal has a specific gravity of 7.88 and a thermal conductivity of 25 W-m$^{-1}$-K$^{-1}$.

The alumina particles were initially coated with the alloy. The metal-to-alumina volume ratios were selected in three different ranges as set forth in Table II hereinbelow:

TABLE II

| | Formulation: | | | | | |
|---|---|---|---|---|---|---|
| | 1 | | 2 | | 3 | |
| Material | Parts Wt. | Volume % | Parts Wt. | Volume % | Parts Wt. | Volume % |
| Alumina (3 μm) | 160 | 15 | 220 | 20 | 375 | 30 |
| Alloy 2 | 1050 | 45 | 900 | 40 | 800 | 30 |
| Silicone oil | 100 | 40 | 100 | 40 | 100 | 40 |

The coating was accomplished by mechanically mixing the alumina powder with the liquid alloy of Example II, and this may be achieved either by hand or in a high-speed mixer. Mixing was followed by addition of the appropriate amount of the silicone oil followed by high-speed mixing until a visually smooth paste was obtained.

| Alloy | Melting Point (° C.) | Gallium (%) | Indium (%) | Tin (%) | Bismuth (%) | Zinc (%) |
|---|---|---|---|---|---|---|
| 1 | 7 | 61 | 25 | 13 | 0 | 1 |

The particulate selected was alumina of Example II. When coated with the liquid gallium alloy, the alumina formed a smooth, thixotropic paste. The polymer matrix chosen was a silicone oil with a kinematic viscosity of 100 centistokes, a specific gravity of 0.86 and a thermal conductivity of 0.15 W-m$^{-1}$-K$^{-1}$. The liquid metal has a specific gravity of 6.5 and a thermal conductivity of 20 W-m$^{-1}$-K$^{-1}$.

The alumina particles were initially coated with the liquid gallium alloy. The liquid metal-to-alumina volume ratios were selected in three different ranges as set forth in Table I hereinbelow:

TABLE III

| | Formulation: | | | | | |
|---|---|---|---|---|---|---|
| | 1 | | 2 | | 3 | |
| Material | Parts Wt. | Volume % | Parts Wt. | Volume % | Parts Wt. | Volume % |
| Alumina (3 μm) | 100 | 8 | 150 | 13 | 200 | 18 |
| Alloy 1 | 1100 | 55 | 1000 | 50 | 900 | 45 |
| Silicone oil | 100 | 37 | 100 | 37 | 100 | 37 |

The coating was accomplished by mechanically mixing the alumina powder with the liquid gallium alloy of Example I, and this may be achieved either by hand or in a high-speed mixer. Mixing was followed by addition of the appropriate amount of the silicone oil followed by high-speed mixing until a visually smooth paste was obtained.

Test Results

The formulation 1 (Table I) was tested for thermal conductivity. The ASTM D5470 method yielded a thermal conductivity of 8.0 W-m$^{-1}$-K$^{-1}$. Controlled thermal impedance testing against industry standard materials was also undertaken. One of these is a generic thermal interface compound from Dow Corning (DC-340 Thermal grease) and another is a high performance compound made by Shin-Etsu Corporation (G-749 Thermal Grease). Also tested was the gallium liquid metal of Example I. The thermal impedance test is shown schematically in FIG. 7. A Motorola IRF840 transistor, in a TO-220 package, was used. It was powered at 60 W (30 V, 2A) and coupled to a heat spreader by the two control compounds and various liquid metal compounds. The heat spreader was a tin-coated copper plate. The heat spreader in turn was coupled to an infinite heat sink, held at 25° C., by DC-340 thermal grease. The temperature drop across the interface (i.e. temperature difference between transistor case and heat spreader) was measured and divided by the power output to obtain a thermal impedance in the units of ° C.-$W^{-1}$. The normalized numbers of represented in Table IV hereinbelow:

TABLE IV

| Interface Material | Thermal Conductivity (W-$m^{-1}$-$K^{-1}$) | Thermal Impedance (Normalized) |
|---|---|---|
| Air | 0.01 | 5–6 |
| Silicone oil | 0.1 | 3 |
| Dow Corning DC-340 | 1.0 | 2 |
| Shin-Etsu [MPU 3.7] G-749 | 3 | 1 |
| Formulation 1 | 8.0 | 0.5–0.6 |
| Liquid metal | 25 | 0.5–0.6 |

Figure 6:
FIG. 6 is a photo-micrograph at 100× illustrating features of the present invention wherein the presence of liquid gallium alloy accommodates bridging in a silicone oil matrix.

Physical evidence of liquid metal enhanced percolation was also obtained by placing formulations between two glass slides. The 100×photo-micrograph of FIG. 6 shows the liquid metal bridging a cluster of particles.

Properties of Liquid Metal Coated Particulate

Figure 1:
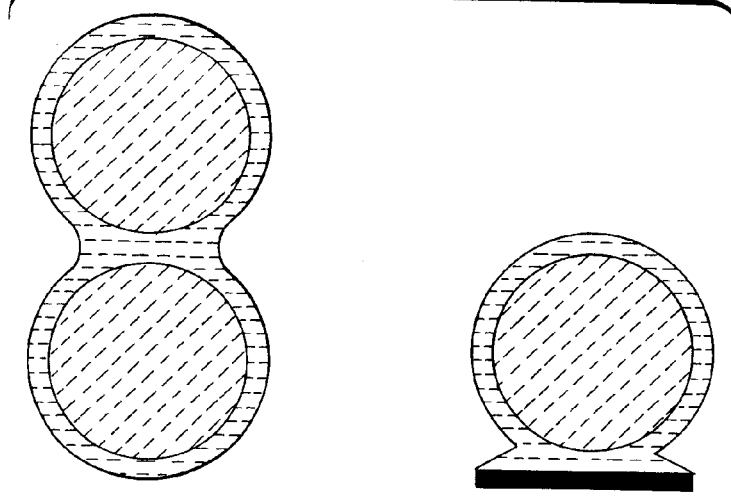

As is illustrated in the drawings, FIG. 1 illustrates the manner in which improved contact is obtained between individual coated particulate, particularly BN coated with a liquid gallium alloy. The surface characteristics or properties of the composite improve the contact through the formation of liquid bridges. This sketch demonstrates the feature of surface wetting of the particulate providing a significant reduction in surface resistivity normally encountered between adjacent particles.

Figure 2:
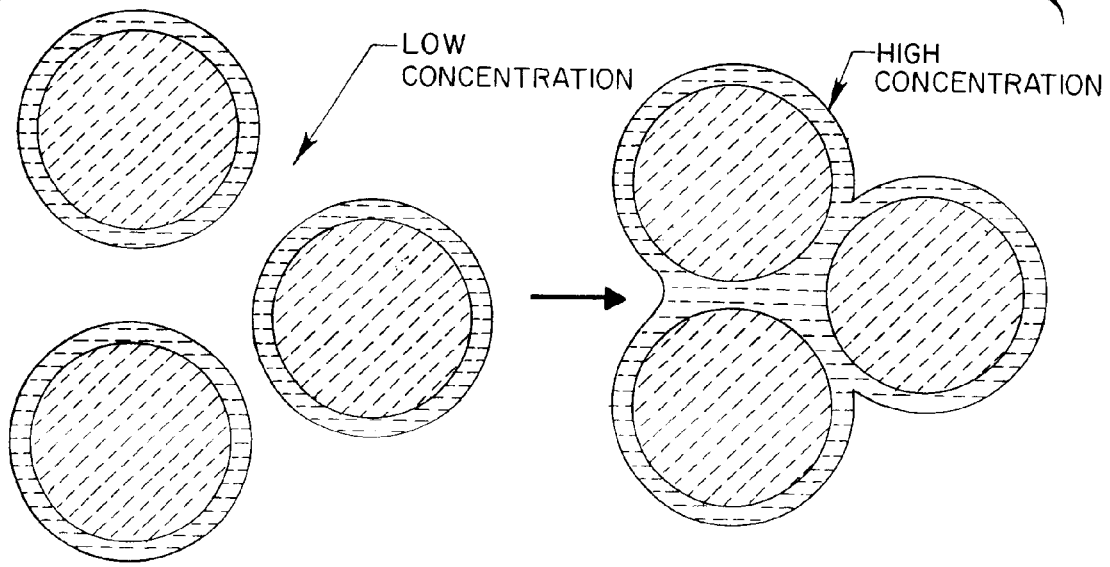

FIG. 2 illustrates the feature of improved percolation resulting from near-critical packing fraction. The surface-to-surface contact as shown in the portion to the left of FIG. 2 is enhanced when a nearcritical packing fraction is achieved through higher concentrations.

Figure 3:
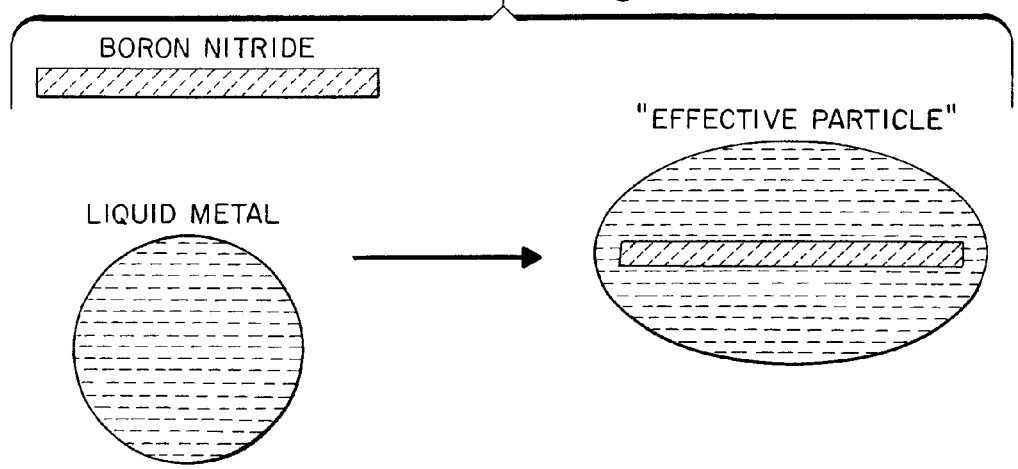
FIG. 3 is a demonstrative sketch similar to FIG. 2 illustrating the reduction of aspect ratio utilizing liquid metal coating, particularly with the platelet configuration of BN particulate.

It is the purpose of FIG. 3 to demonstrate the reduction in aspect ratio achieved with liquid metal coating of particulate. Since boron nitride has an anisotropic platelet structure, its performance in applications contemplated by the present invention are enhanced. With the liquid metal coating, the "effective particle" configuration becomes more ellipsoidal.

Figure 4:
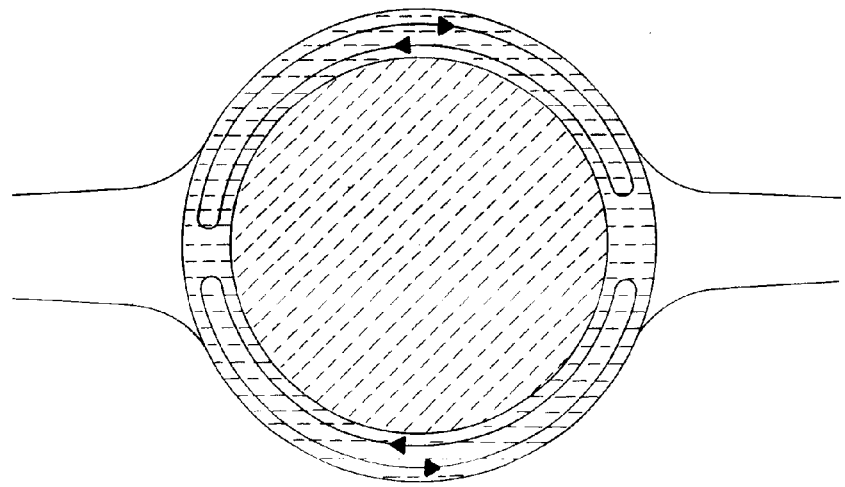
FIG. 4 illustrates the feature of utilizing a soft liquid gallium alloy as a coating for particle, so as to lower viscous dissipation.

It is the purpose of FIG. 4 to demonstrate the advantageous feature of the present invention for coating the individual particles, thus lowering viscous dissipation. Improved overall performance can be expected and is accordingly obtained.

FIG. 5 demonstrates the feature of the present invention wherein individual discrete liquid metal coated particulate will form aggregations or agglomerates, with separation of discrete droplets being achieved when the coated particulate is blended with a polymeric material such as silicone oil. Certain of these features become manifest from the photo-micrograph of FIG. 6.

Figure 7:
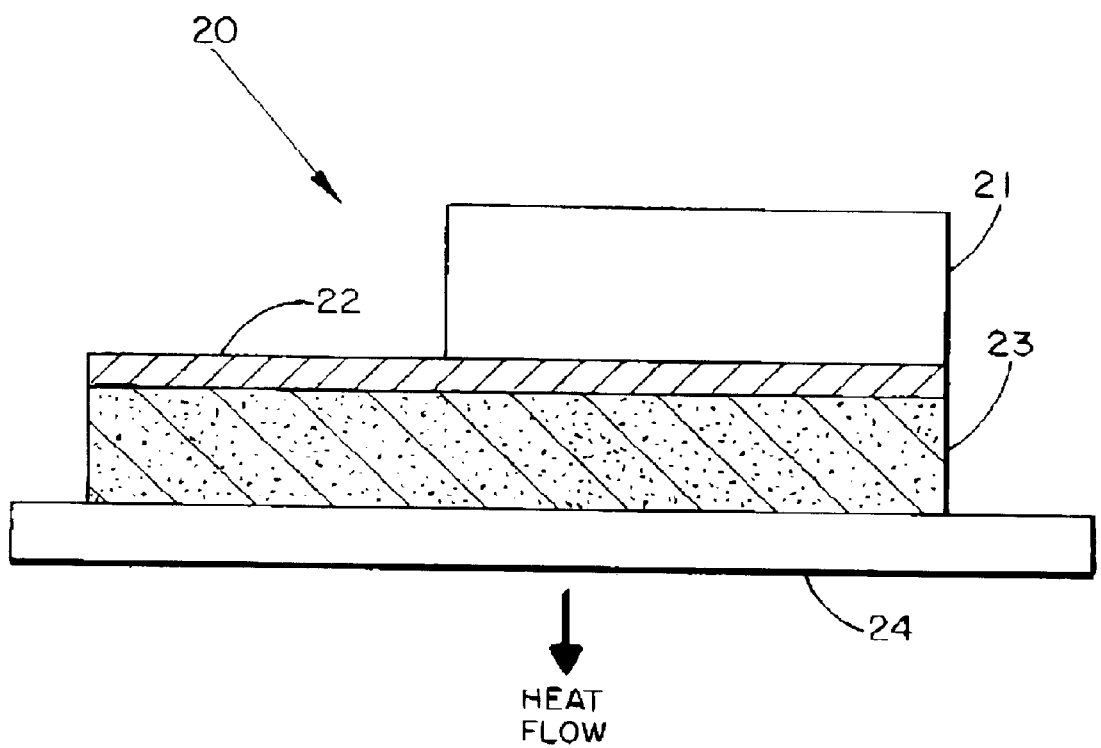
FIG. 7 illustrates diagrammatically the features of the testing equipment utilized in measuring the thermal performance of devices of the present invention.

With attention now being directed to FIG. 7 of the drawings, it will be observed that the assembly generally designated 20 includes a heat generating semiconductor device as at 21 mounted upon a suitable or conventional copper base as at 22. A compliant interface made pursuant to the present invention is illustrated at 23, with the interface being interposed between the opposed surfaces of copper base 22 and heat sink member 24. Heat flow occurs along the line and in the direction of the indicating arrow.

Figure 9:
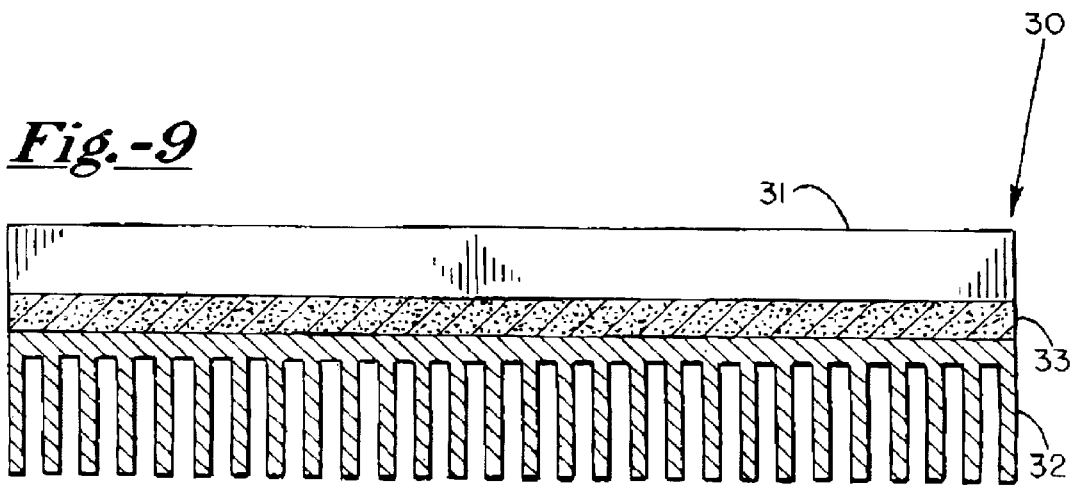
FIG. 9 is an illustration of a typical semiconductor mounted on a hinged heat sink, and having the compliant pad prepared in accordance with the present invention interposed between opposed surfaces of the semiconductor device and heat sink.

FIG. 9 is provided to demonstrate the utilization of the compliant pad of the present invention in connection with a heat generating semiconductor device of conventional configuration. Accordingly, the assembly 30 shown in FIG. 9, includes a heat generating semiconductor device or package illustrated at 31 having a heat sink, heat spreader, or other heat dissipating member illustrated at 32. Interposed between the opposed surfaces of semiconductor device 31 and heat dissipating member 32 is a mechanically compliant pad 33 prepared in accordance with the present invention.

Figure 8:
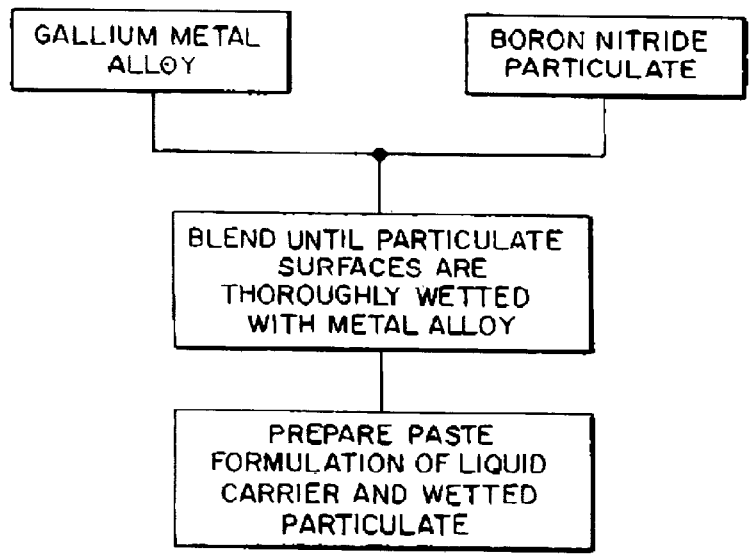
FIG. 8 is a flow chart illustrating the steps undertaken in preparation of the compliant pads of the present invention.

FIG. 8 is a flow diagram of the steps undertaken in accordance with the creation of compliant pads in accordance with the present invention. As indicated, and as is apparent from the flow diagram, the particulate and alloy are blended until the surfaces of the particulate are thoroughly wetted, and thereafter a paste formulation is prepared through the addition of a liquid polymer.

General Commentary

As previously indicated, BN or alumina particulate can range in size from up to about 1 micron diameter and up to about 40 microns in cross-sectional thickness. It will be observed that the platelet-like configuration of boron nitride in particular provides a highly desirable combination when wetted with liquid metal, with the effective particle being illustrated in FIG. 3 of the drawings. Viscosity control is aided by this feature.

The silicone oil utilized in the example is a typical liquid silicone, typically VEB 100 (Sivento Inc., previously Huls America), with these materials being, of course, commercially available. Viscosities up to about 1000 centistokes may be satisfactorily utilized.

One unusual feature of the present invention was electrical resistivity. When Formulation 1 is formed in a pad between opposed surfaces of a semiconductor and a heat sink, the resistivity has been found to be highly significant, having a value of up to about $10^{12}$ Ω-cm (Formulation 1, Table I).

It will be appreciated that the above examples are given for purposes of illustration only and are not to be otherwise construed as a limitation upon the scope of the following appended claims.

What is claimed is:

1. A method of preparing thermally conductive mechanically compliant pads comprising the steps of:
   (a) preparing a mixture of:
      (1) a quantity of a gallium and/or indium containing alloy which is in liquid state temperatures below 120° C.;
      (2) a thermally conductive particulate solid consisting essentially of boron nitride;
   (b) mechanically blending said mixture to cause the surfaces of said particulate to become wetted with said liquid alloy to form a homogeneous paste wherein said liquid alloy encapsulates individual of said boron nitride particles;
   (c) combining said paste with a quantity of a flowable plastic resin material to form a thermally conductive mass with said thermally conductive mass comprising from between about 10% and 90% by volume of metal coated particulate, balance flowable plastic resin.

2. The method of claim 1 wherein the particles making up said thermally conductive particulate solid have a diameter of between about 1 microns and 40 microns.

3. The method of claim 1 wherein said liquid alloy substantially encapsulates the particles to form a coating thereon, typically liquid metal to particle volume ratio being at least 1:1 to obtain good thermal performance.

4. The method of claim 1 wherein said homogeneous paste is further blended with silicone resin to form a conformable pad, with the pad comprising between about 10% and 90% by volume of homogeneous paste, balance polysiloxane.

5. The method of claim 1 being particularly characterized in that said liquid metal alloy is in liquid state at temperatures below 60° C.

6. The compliant thermally conductive pad prepared in accordance with the steps of claim 1.

7. The method of preparing thermally conductive mechanically compliant pads comprising the steps of:

(a) preparing a mixture of:
  (1) a liquid metal alloy with a component selected from the group consisting of gallium and indium, and being in the liquid state at temperatures below 120° C.; and
  (2) a thermally conductive particulate solid selected from the group consisting of boron nitride, aluminum nitride, and alumina;

(b) mechanically blending said mixture to cause the surfaces of said particulate to become wetted with said liquid alloy to form a homogeneous paste wherein said liquid alloy encapsulates individual of said particles comprising said particulate;

(c) combining said paste with a quantity of a flowable plastic resin material to form a thermally conductive mass with said thermally conductive mass comprising from between about 10% and 90% by volume of metal coated particulate, balance flowable plastic resin.

* * * * *

UNITED STATES PATENT AND TRADEMARK OFFICE
CERTIFICATE OF CORRECTION

PATENT NO.     : 6,339,120 B1
DATED          : January 15, 2002
INVENTOR(S)    : Sanjay Misra and Richard M. Olson It is certified that error appears in the above-identified patent and that said Letters Patent is hereby corrected as shown below:

<u>Title page,</u>
"7 Claims, 5 Drawings Sheets" should be -- 7 Claims, 6 Drawing Sheets --.

<u>Drawings,</u>
Figures 1 through 4 of the patent are incorrect, and should appear as set forth in the attached Figures 1 through 4. The remaining Figures 5-9 are correct as printed.

The Drawing Sheets 1-5 should be renumbered as -- Sheet 1-6 --.

Signed and Sealed this

Thirteenth Day of August, 2002

Attest:

JAMES E. ROGAN
Attesting Officer          Director of the United States Patent and Trademark Office